United States Patent
Aoyagi

(10) Patent No.: US 7,408,785 B2
(45) Date of Patent: Aug. 5, 2008

(54) STRUCTURE FOR MOUNTING ELECTRONIC COMPONENT ON WIRING BOARD

(75) Inventor: Toru Aoyagi, Tokyo (JP)

(73) Assignee: Alps Electric Co., Ltd, Tokyo (JP)

( * ) Notice: Subject to any disclaimer, the term of this patent is extended or adjusted under 35 U.S.C. 154(b) by 85 days.

(21) Appl. No.: 11/127,580

(22) Filed: May 12, 2005

(65) Prior Publication Data

US 2005/0257954 A1    Nov. 24, 2005

(30) Foreign Application Priority Data

May 18, 2004   (JP)   ............... 2004-147891

(51) Int. Cl.
*H05K 7/00*   (2006.01)
(52) U.S. Cl. ............. 361/760; 174/257; 174/260; 29/829; 361/748
(58) Field of Classification Search ......... 361/118, 361/748–804; 257/678; 324/765; 174/257, 174/260
See application file for complete search history.

(56) References Cited

U.S. PATENT DOCUMENTS

| 6,998,532 | B2 * | 2/2006 | Kawamoto et al. | 174/521 |
| 7,142,000 | B2 * | 11/2006 | Eldridge et al. | 324/765 |
| 2002/0175421 | A1 * | 11/2002 | Kimura | 257/778 |
| 2003/0000067 | A1 * | 1/2003 | Hori | 29/592.1 |
| 2004/0178486 | A1 * | 9/2004 | Maeda | 257/678 |
| 2004/0195682 | A1 * | 10/2004 | Kimura | 257/723 |
| 2005/0013082 | A1 * | 1/2005 | Kawamoto et al. | 361/118 |
| 2005/0218503 | A1 * | 10/2005 | Abe et al. | 257/700 |

FOREIGN PATENT DOCUMENTS

| JP | 8-88464 | 4/1996 |
| JP | 9-27661 | 1/1997 |

* cited by examiner

*Primary Examiner*—Jeremy C. Norris
*Assistant Examiner*—Abiy Getachew
(74) *Attorney, Agent, or Firm*—Brinks Hofer Gilson & Lione

(57) ABSTRACT

A structure for mounting an electronic component on a wiring board according to the invention includes a wiring board that is provided with wiring patterns, each having a land portion, and an electronic component that has a plurality of electrodes which are soldered to the land portions. Each land portion is made of a first metallic material which is solderable. Further, on each wiring pattern adjacent to each land portion, a second metallic material which is nonsolderable is provided.

8 Claims, 2 Drawing Sheets

STRUCTURE FOR MOUNTING ELECTRONIC COMPONENT ON WIRING BOARD

This application claims the benefit of priority to Japanese Patent Application No. 2004-147891 filed on May 18, 2004, herein incorporated by reference.

BACKGROUND OF THE INVENTION

1. Field of the Invention

The present invention relates to a structure for mounting an electric component on a wiring board, which is suitable for various electronic circuit units and the like.

2. Description of the Related Art

FIG. 4 is a cross-sectional view showing essential parts of a structure for mounting an electronic component on a wiring board according to a related art. Next, the configuration of the structure for mounting an electronic component on a wiring board according to the related art will be described with reference to FIG. 4. An electronic component 51, such as a semiconductor chip or the like, has a main body portion 51a and a plurality of electrodes 51b provided on the bottom surface of the main body portion 51a.

On a surface of a wiring board 52, wiring patterns 53 which are made of solderable metallic materials and have land portions 53a are provided. Further, a nonsolderable solder resist film 54 is provided on the entire surface of the wiring board 52 and on the wiring patterns 53 excluding the land portions 53a, such that soldering regions of the land portions 53a are formed by the solder resist film 54.

Electrodes 51b of the electronic component 51 are soldered to the land portions 53a by solders 55. Further, a gap provided between the main body portion 51a and the solder resist film 54 is filled with an adhesive (underfill resin) 56. Then, the main body portion 51a is adhered to the wiring board 52, such that the electronic component 51 is stably mounted. (For example, see Japanese Unexamined Patent Application Publication No. 8-88464)

However, in the structure for mounting an electronic component on a wiring board according to the related art, the solder resist film 54 is provided on the wiring patterns 53 excluding the land portions 53a and on the entire surface of the wiring board 52. Accordingly, it is difficult to form the solder resist film 54, which results in degrading productivity. Further, since the adhesive 56 is adhered to the solder resist film 54, the solder resist film 54 may be removed, such that the electronic component 51 may be mounted weakly.

As described above, in the structure for mounting an electronic component on a wiring board according to the related art, the solder resist film 54 is provided on the wiring patterns 53 excluding the land portions 53a and on the entire surface of the wiring board 52. Accordingly, it is difficult to form the solder resist film 54, which results in degrading productivity. Further, since the adhesive 56 is adhered to the solder resist film 54, the solder resist film 54 may be removed, such that the electronic component 51 may be mounted weakly.

SUMMARY OF THE INVENTION

Accordingly, it is an object of the invention to provide a structure for mounting an electronic component on a wiring board, which has favorable productivity and which can stably mount the electronic component.

In order to solve the above-described problems, according to a first aspect of the invention, there is provided a structure for mounting an electronic component on a wiring board. The structure includes a wiring board that is provided with wiring patterns, each having a land portion, and an electronic component that has a plurality of electrodes which are soldered to the land portions. Each land portion is made of first metallic material which is solderable. Further, on each wiring pattern adjacent to each land portion, a second metallic material which is nonsolderable is provided.

Further, it is preferable that the second metallic material includes chromium, titanium, or an alloy mainly having chromium or titanium.

Further, it is preferable that the first metallic material includes copper, tin, or an alloy mainly having copper or tin.

Further, it is preferable that the wiring board is made of epoxy-based resin, ceramic, or alumina and the first and second metallic materials are formed in thick films or thin films on the wiring board.

Further, it is preferable that each wiring pattern and each land portion are made of the first metallic materials and each wiring pattern adjacent to each land portion is coated with the second metallic material.

Further, it is preferable that each wiring pattern is made of the second metallic material and each land portion is partially formed on the second metallic material. Further, it is preferable that an adhesive is provided into a gap provided between a main body portion of the electronic component and the wiring patterns and the main body portion of the electronic component is adhered to surfaces of the wiring patterns via the adhesive.

DESCRIPTION OF THE PREFERRED EMBODIMENT

Figure 1:
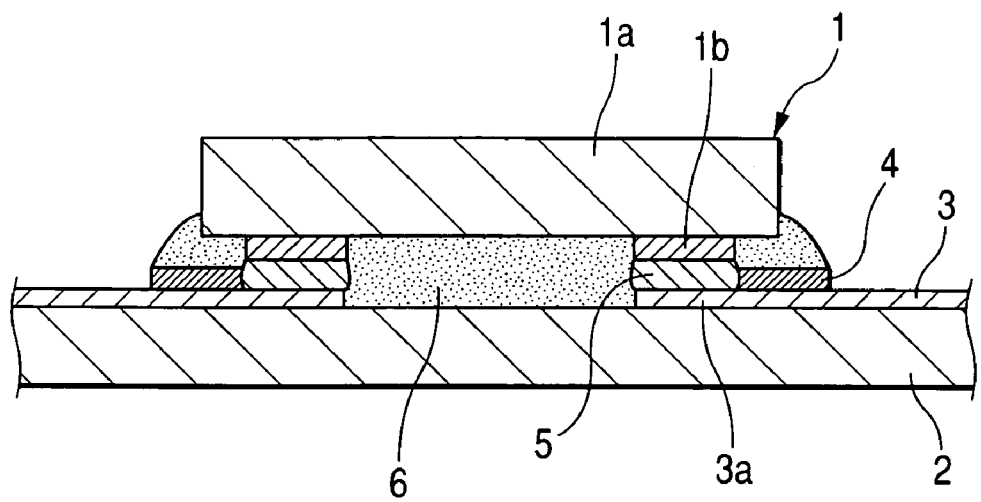
FIG. 1 is a cross-sectional view showing essential parts of a structure for mounting an electronic component on a wiring board according to a first embodiment of the invention.
Figure 2:
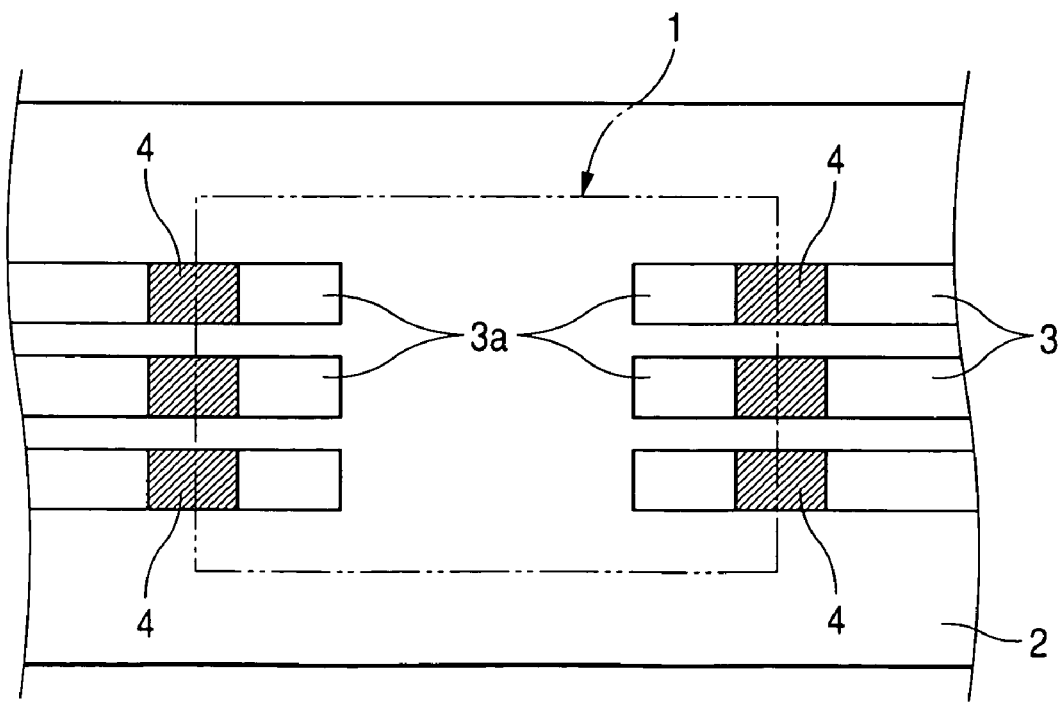
FIG. 2 is a plan view of the wiring board of the structure for mounting an electronic component on a wiring board according to the first embodiment of the invention.
Figure 3:
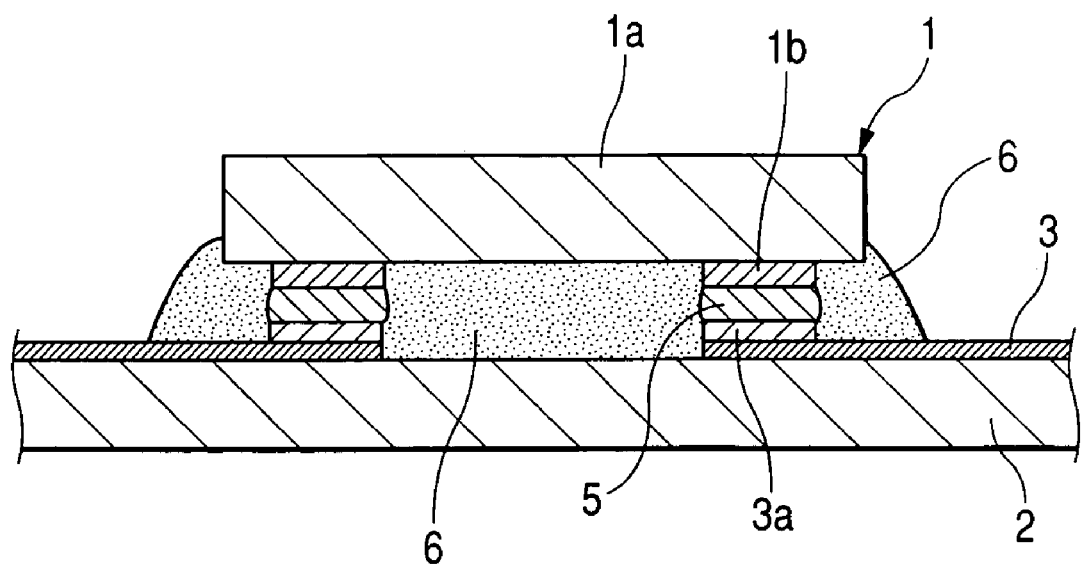
FIG. 3 is a cross-sectional view showing essential parts of a structure for mounting an electronic component on a wiring board according to a second embodiment of the invention.
Figure 4:
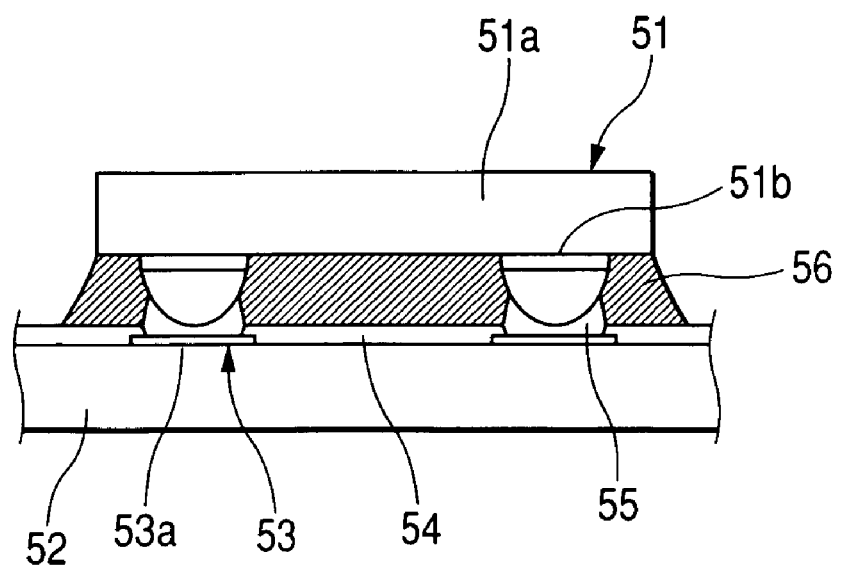
FIG. 4 is a cross-sectional view showing essential parts of a structure for mounting an electronic component on a wiring board according to a related art.

Now, a structure for mounting an electronic component on a wiring board according to the invention will be described with reference to the drawings. FIG. 1 is a cross-sectional view showing essential parts of a structure for mounting an electronic component on a wiring board according to a first embodiment of the invention. FIG. 2 is a plan view of the wiring board of the structure for mounting an electronic component on a wiring board according to the first embodiment of the invention. FIG. 3 is a cross-sectional view showing essential parts of a structure for mounting an electronic component on a wiring board according to a second embodiment of the invention.

Next, the configuration of the structure for mounting an electronic component on a wiring board according to the first embodiment of the invention will be described with reference to FIGS. 1 and 2. An electronic component 1 such as a semiconductor chip or the like has a main body portion 1a and a plurality of electrodes 1b provided on the bottom surface of the main body portion 1a.

A wiring board 2 is made of epoxy-based resin, ceramic, or alumina. On a surface of the wiring board 2, wiring patterns 3, each having a solderable land portion 3a, are provided by thick film techniques or thin film techniques.

The land portion 3a and the wiring pattern 3 are made of first metallic materials which are solderable. The first metallic material includes copper, tin, or an alloy mainly having copper or tin. Further, a coated portion 4 is provided to partially cover the wiring pattern 3 adjacent to the land portion 3a. The coated portion 4 is made of a second metallic material which is nonsolderable. Soldered regions of the land portions 3a are formed by the coated portions 4.

As a result, the surface of the wiring pattern 2 is mostly exposed.

In addition, the second metallic material for the coated portion 4 which is nonsolderable includes chromium, titanium, or an alloy mainly having chromium or titanium. The coated section 4 is partially formed on the wiring board 2 by thick film techniques or thin film techniques.

In a state in which the electronic component 1 is mounted on the wiring board 2, the electrodes 1b are soldered to the land portions 3a by solders 5 and a gap between the main body portion 1a and the wiring board 2 is filled with an adhesive 6 (underfill resin). Accordingly, the main body portion 1a is adhered to the wiring board 2, such that the electronic component 1 is mounted stably.

At this time, the adhesive 6 is directly adhered to the surface of the wiring board 2, such that the adhesive 6 is adhered stably thereto.

In addition, FIG. 3 shows a structure for mounting an electronic component on a wiring board according to a second embodiment of the invention. Now, the second embodiment will be described with reference to FIG. 3. The wiring pattern 3 is made of the second metallic material which is nonsolderable. The second metallic material includes chromium, titanium, or an alloy mainly having chromium or titanium. The land portion 3a is provided partially on the second metallic material. The land portion 3a is made of the first metallic material which is solderable. The first metallic material includes copper, tin, or an alloy mainly having copper or tin. The soldered region of the land portion 3a is formed by the second metallic material which is the wiring pattern 3.

Other elements are the same as those of the first embodiment. Then, the same elements are represented by the same components as those of the first embodiment and the descriptions thereof will be omitted.

Moreover, although the structures which are applied to the semiconductor chips have been described in the above-described embodiments, it is needless to say that the structure can be applied to electronic components other than the semiconductor chips.

The structure for mounting an electronic component on a wiring board according to the invention includes the wiring board that is provided with the wiring patterns, each having the land portion, and the electronic component that has the plurality of the electrodes which are soldered to the land portions. Each land portion is made of the first metallic material which is solderable. Further, on each wiring pattern adjacent to each land portion, a second metallic material which is nonsolderable is provided. Accordingly, the solder leakage from the land portion can be prevented owing to the second metallic material and thus the solder resist film in the related art is not required. Therefore, productivity can be enhanced. Further, since the electronic component can be adhered to the surface of the wiring board via the adhesive. As a result, it is possible to obtain the mounting structure in which the electronic component is mounted stably.

In addition, since the second metallic material includes chromium, titanium, or an alloy primarily having chromium or titanium, the land portions can be accurately partitioned by the second metallic material which is nonsolderable. Therefore, the soldered regions can be obtained with high precision.

In addition, since the first metallic material includes copper, tin, or an alloy primarily having copper or tin, the material cost is inexpensive, and thus the mounting structure can be obtained at low cost.

In addition, the wiring board is made of epoxy-based resin, ceramic, or alumina and the first and the second metallic material are formed in the thick films or thin films on the wiring board. Therefore, the wiring patterns having the reduced sizes can be obtained with high precision.

In addition, the wiring pattern and the land portion are formed of the first metallic materials and the wiring pattern adjacent to the land portion is coated with the second metallic material. Therefore, the second metallic material which is nonsolderable may be partially formed, such that the second metallic material can be easily formed. Further, since the electronic component can be adhered to the surface of the wiring board via the adhesive. As a result, it is possible obtain the mounting structure in which the electronic component is mounted stably.

In addition, the wiring pattern is made of the second metallic material and the land portion is partially formed on the second metallic material. Therefore, the land portion can be formed with high precision.

In addition, the adhesive is provided in the gap provided between the main body portion of the electronic component and the wiring patterns and the main body portion is adhered to the surfaces of the wiring patterns via the adhesive. Therefore, the electronic component can be adhered to the surface of the wiring board via the adhesive. As a result, it is possible to obtain the mounting structure in which the electronic component is mounted stably.

The invention claimed is:

1. A structure for mounting an electronic component on a wiring board, the structure comprising:
   a wiring board that is provided with wiring patterns, each having a land portion; and
   an electronic component that has a plurality of electrodes which are soldered to the land portions;
   wherein each land portion is made of a first metallic material which is solderable and, on each wiring pattern adjacent to each land portion, a second metallic material which is non-solderable is provided, each land portion being provided with a soldered region which is partitioned by the second metallic material.

2. The structure for mounting an electronic component on a wiring board according to claim 1,
   wherein the second metallic material includes chromium, titanium, or an alloy mainly having chromium or titanium.

3. The structure for mounting an electronic component on a wiring board according to claim 1,
   wherein the first metallic material includes copper, tin, or an alloy mainly having copper or tin.

4. The structure for mounting an electronic component on a wiring board according to claim 1,
   wherein the wiring board is made of epoxy-based resin, ceramic, or alumina and the first and second metallic materials are formed in thick films or thin films on the wiring board.

5. The structure for mounting an electronic component on a wiring board according to claim 1, wherein each wiring pattern and each land portion are made of the first metallic materials and each wiring pattern adjacent to each land portion is coated with the second metallic material.

6. The structure for mounting an electronic component on a wiring board according to claim 1,
wherein each wiring pattern is made of the second metallic material and each land portion is partially formed on the second metallic material.

7. The structure for mounting an electronic component on a wiring board according to claim 1,
wherein an adhesive is provided in a gap between a main body portion of the electronic component and the wiring patterns and the main body portion of the electronic component is adhered to surfaces of the wiring patterns via the adhesive.

8. The structure for mounting an electronic component on a wiring board according to claim 1, wherein each land portion being provided with a soldering region.

* * * * *